United States Patent [19]
Osterdock et al.

[11] Patent Number: 5,440,313
[45] Date of Patent: Aug. 8, 1995

[54] GPS SYNCHRONIZED FREQUENCY/TIME SOURCE

[75] Inventors: Terry N. Osterdock, Los Gatos; David C. Westcott, San Jose; Quyen D. Hua, Milpitas, all of Calif.

[73] Assignee: Stellar GPS Corporation, San Jose, Calif.

[21] Appl. No.: 67,947

[22] Filed: May 27, 1993

[51] Int. Cl.⁶ .................... H04B 7/185; G04B 18/00; H04L 7/04
[52] U.S. Cl. .................................. 342/352; 342/357; 368/200; 375/362
[58] Field of Search ............... 342/357, 352; 331/44, 331/55, 30, 40, 17, 25; 375/111; 368/200; 455/259, 260, 264, 265

[56] References Cited

U.S. PATENT DOCUMENTS

| | | | |
|---|---|---|---|
| 3,614,630 | 10/1971 | Rorden | 331/17 |
| 3,763,492 | 10/1973 | Easton | 455/265 |
| 4,457,006 | 6/1984 | Maine | 455/264 |
| 4,578,678 | 3/1986 | Hurd | 342/357 |
| 4,582,434 | 4/1986 | Plangger et al. | 368/46 |
| 4,689,626 | 8/1987 | Hori et al. | 342/357 |
| 4,899,117 | 2/1990 | Vig | 331/3 |
| 5,043,736 | 8/1991 | Darnell et al. | 342/357 |
| 5,070,537 | 12/1991 | Ohira et al. | 455/67 |
| 5,098,839 | 3/1992 | Kohno et al. | 375/1 |
| 5,108,334 | 4/1992 | Eschenbach et al. | 455/314 |
| 5,148,437 | 9/1992 | Ohtsu et al. | 372/32 |
| 5,153,599 | 10/1992 | Harigae et al. | 342/352 |
| 5,184,347 | 2/1993 | Farwell et al. | 370/94.1 |

Primary Examiner—Gregory C. Issing
Attorney, Agent, or Firm—Burns, Doane, Swecker & Mathis

[57] ABSTRACT

A GPS-based frequency/time source of the present invention provides an accurate, traceable low cost reference. In particular, the GPS-based frequency/time source includes a GPS receiver, a variable frequency oscillator and a micro processor. The GPS receiver receives and produces as output signals GPS information, whereas the variable frequency oscillator has a frequency control input terminal and produces an output frequency signal, and is coupled to the GPS receiver. The micro processor is coupled to receive the output signals produced by the GPS receiver and produces an error signal indicative of a difference in frequency between GPS synchronized frequency and the output frequency signal of the variable frequency oscillator. Circuitry is responsive to the error signal to produce an electronic frequency control signal, which is applied to the frequency control input of the variable frequency oscillator so as to cause the difference in frequency to be reduced. In this manner, a low cost oscillator may be employed in such a way as to produce a very accurate output frequency signal.

7 Claims, 2 Drawing Sheets

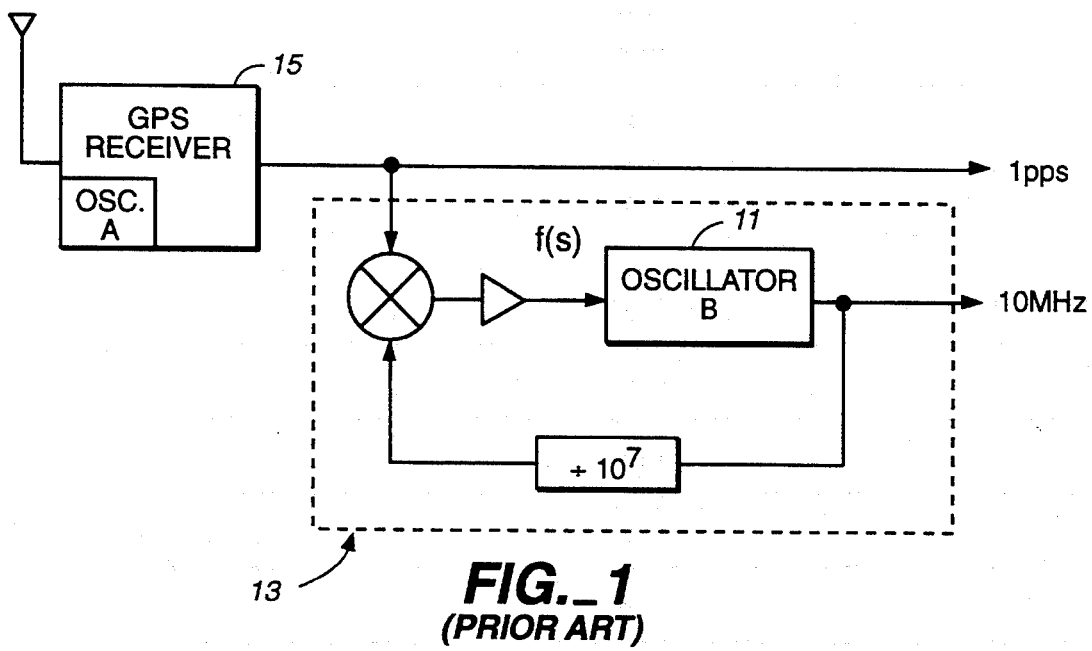
FIG._1
*(PRIOR ART)*
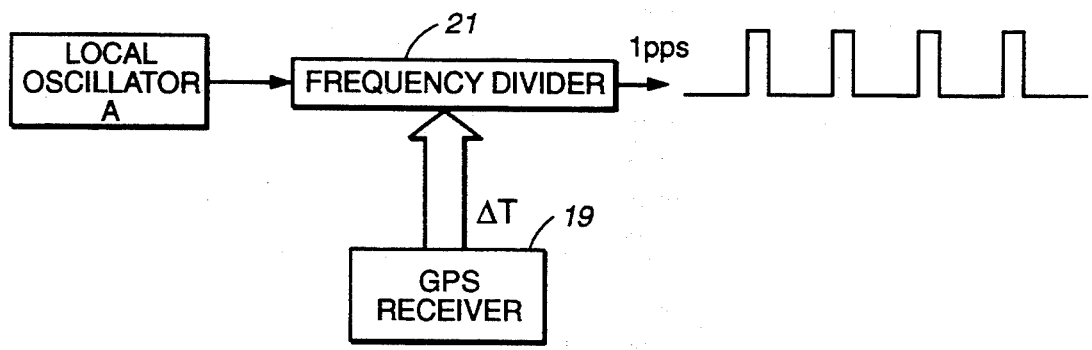
FIG._2
*(PRIOR ART)*
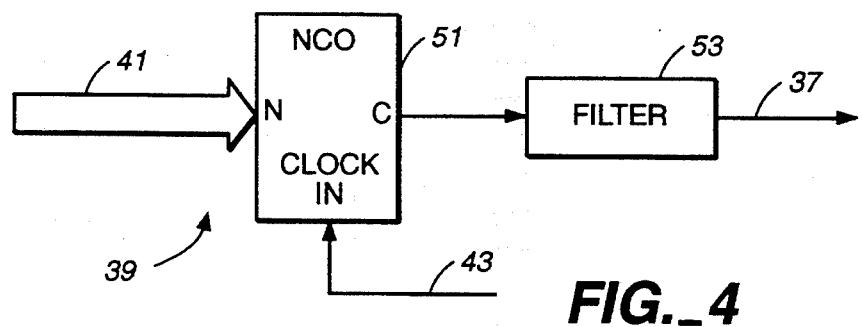
FIG._4

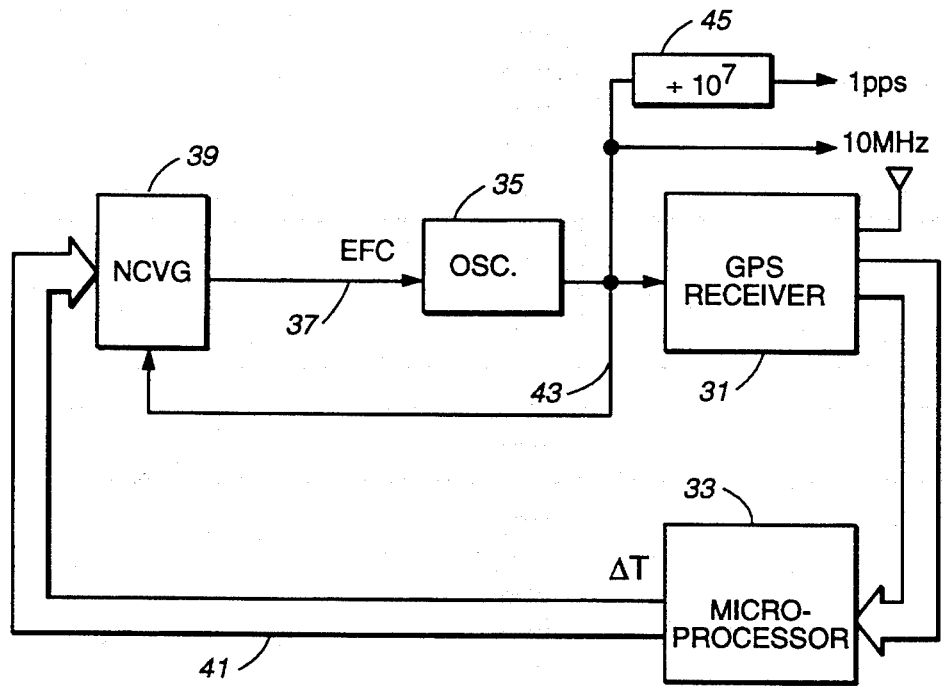
FIG._3
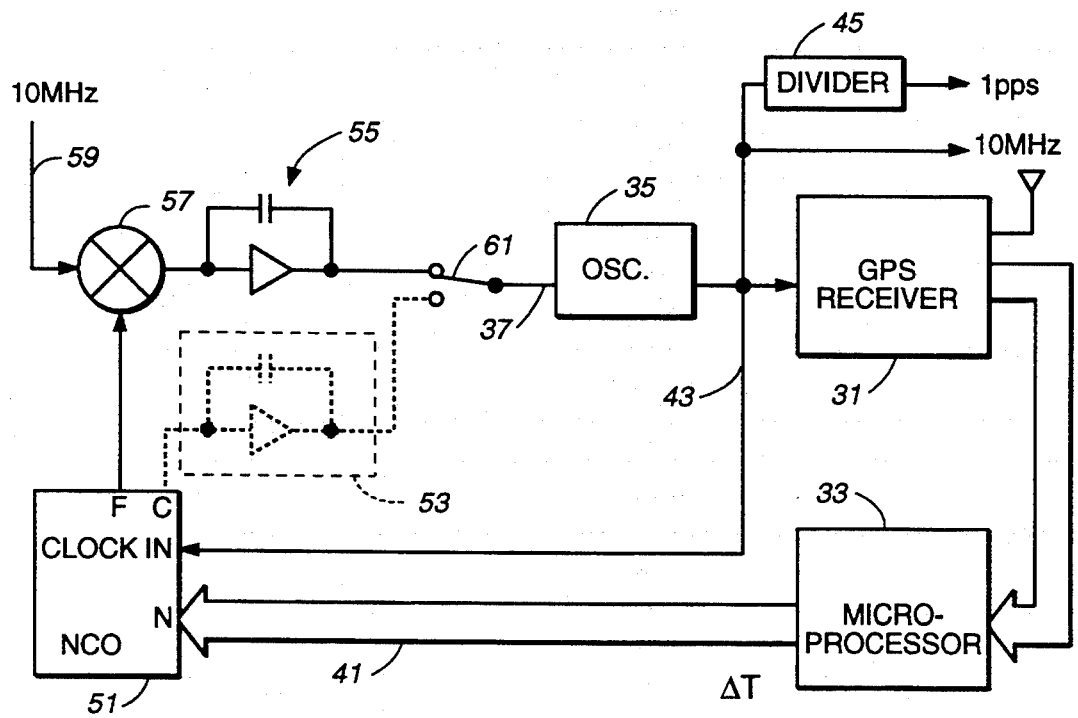
FIG._5

GPS SYNCHRONIZED FREQUENCY/TIME SOURCE

BACKGROUND OF THE INVENTION

1. Field of the Invention

The present invention relates to frequency and time sources, and more particularly to high performance GPS-based frequency and time sources.

2. State of the Art

The NAVSTAR Global Positioning System (GPS) is a very precise satellite-based navigation system being installed by the U.S. Department of Defense. When fully operational, there will be 24 satellites orbiting the earth in 12-hour orbits. The present system provides full 24-hour service for time broadcast and two-dimensional navigation. The GPS system is the first navigation system that offers global coverage, precise navigation in all weather conditions, and spread spectrum transmission to minimize interference and terrain effects. The GPS system provides position information in three dimensions (latitude, longitude, and altitude) and provides a precise time signal.

In operation, each of the satellites is continually broadcasting its own position and its own very precise time. The object of a GPS receiver is to determine its own latitude, longitude, and altitude, and to determine time. To determine these four unknowns, the receiver must listen to and use the signals from four satellites.

The advent of commercial access to the NAVSTAR Global Positioning System (GPS) has made possible GPS-based frequency and time sources providing precision performance, stable frequency and accurate time outputs. Applications of GPS-based frequency and time sources include network communications, production test and calibration and electric power distribution. Specifically, as communications systems strive for faster and faster data rates, the concept of Bit Error Rate (BER) plays a more important role. To achieve low BERs, network synchronization is critical; that is, the frequencies at each node in the system have to be maintained more closely, more accurately, and with less drift than previously allowed.

A GPS-based time source, or GPS clock, addresses the foregoing key concerns of communications providers. Frequency, accuracy and stability are similar to those obtainable from atomic frequency standards. The GPS system offers time stability to within 300 ns. Typical pulse-to-pulse jitter in GPS timing receivers however, is 40 to 60 ns. In the design of GPS receivers, emphasis has conventionally been placed on producing a time output (1 pulse per second, or 1 pps) having a short-term average that is very accurate in relation to GPS time. Pulse-to-pulse jitter has typically not been an overriding concern. A frequency output (for example, 10 Mhz) is generated based on the time output. Such an arrangement is illustrated in FIG. 1, in which an oscillator 11 is incorporated in a closed loop frequency multiplier 13 that receives as an input a 1 pulse per second output of the GPS receiver 15 and produces therefrom a 10 Mhz frequency output signal. The GPS receiver 15 uses its own free-running local oscillator 17 to receive transmissions from GPS satellites so as to produce the 1 pulse per second time output.

The manner in which the 1 pulse per second output is produced is shown in greater detail in FIG. 2. The signal derived from the local oscillator 17 is frequency divided 21 to produce the 1 pulse per second output. Because the local oscillator 17 is free-running, its output signal will exhibit some time bias $\Delta T$ (or drift) with respect to GPS time. A GPS processor 19 calculates the time bias and changes the count in a counter 21 of the frequency divider so as to correct for the time bias. This technique is known as "jamming the clock". With the correction, the short-term average of the 1PPS time output will be accurate in relation to GPS time. The time output will contain considerable pulse-to-pulse jitter, however, due to the fact that it is continually "jam-set" with the consequence that the accuracy of the 10 Mhz frequency multiplier output 13 is impaired. Such jitter prevents the full benefit of a GPS-based time source from being realized.

In the field of production test and calibration, clearly, the more accurate the frequency standard, the faster calibration of a unit under test may be performed. Ideally, the frequency standard employed would be the Cesium Standard. The cost of a Cesium Standard, however, is often times prohibitive. The Cesium Standard is a primary standard that does not need to be calibrated, although its performance does need to be monitored to assure that the standard is operating properly.

Secondary standards, such as Rubidium and Quartz cost less than a Cesium Standard, although a Rubidium Standard is still quite expensive. Whether a Rubidium Standard or Quartz Oscillator, or even a Cesium Standard, is used, traceability to a National Standard reference must be maintained. A GPS-based clock is an acceptable means world-wide of obtaining the traceability needed in the calibration of frequency based devices. Furthermore, GPS-based clocks are continuously calibrated. In production test operations, therefore, the frequency source does not have to be removed for calibration.

In these and other applications, a need exists for a GPS-based frequency/time source that exhibits the greatest possible accuracy at the lowest possible cost. In communications network applications in particular, an affordable GPS frequency/time source would allow such a source to be installed at every node in a network to achieve faster data rates using the highest frequency stability standards currently achievable.

SUMMARY OF THE INVENTION

Generally speaking, the GPS-based frequency/time source of the present invention provides an accurate, traceable low-cost frequency/time reference. In particular, the invention includes a GPS receiver, a variable-frequency oscillator and a micro processor. The GPS receiver receives and produces as output signals GPS information, whereas the variable-frequency oscillator has a frequency control input terminal and produces an output frequency signal, and is coupled to the GPS receiver. The micro processor is coupled to receive the output signals produced by the GPS receiver and produces an error signal indicative of a difference in frequency between a GPS-synchronized frequency and the output frequency signal of the variable-frequency oscillator. Circuitry is responsive to the error signal to produce an electronic frequency control signal, which is applied to the frequency control input of the variable frequency oscillator so as to cause the difference in frequency to be reduced. In this manner, a low-cost oscillator may be employed in such a way as to produce a very accurate output frequency signal.

BRIEF DESCRIPTION OF THE DRAWINGS

FIG. 1 is a simplified block diagram of a conventional GPS-based frequency/time source;

FIG. 2 is a simplified block diagram of a time reference generating portion of the conventional GPS-based frequency/time source of FIG. 1;

FIG. 3 is a simplified block diagram of one embodiment of a GPS-based frequency/time source in accordance with the present invention;

FIG. 4 is a simplified block diagram of a Number Controlled Voltage Generator (NCVG) employed in the GPS-based frequency/time source of FIG. 3; and FIG. 5 is a simplified block diagram of another embodiment of a GPS-based frequency/time source in accordance with the present invention.

DETAILED DESCRIPTION OF THE PREFERRED EMBODIMENTS

The present GPS clock features a receiver architecture that provides the most stable frequency outputs available from GPS. The GPS clock produces an extremely stable 1 pps pulse (less than 1 ns rms jitter) that may be used to advantage in many applications including those previously described. The GPS clock may be embodied as a compact receiver optimized to automatically decode signals from the GPS system to provide exceedingly accurate frequency and time outputs. The level of accuracy and precision obtainable is comparable to Cesium-based frequency reference standards. The architecture of the present GPS clock enables high performance to be obtained using low cost components. Performance comparable to Cesium based frequency reference standards may therefore be obtained at a cost comparable to quartz oscillator systems.

In the system shown in FIG. 3, GPS signals are received by a GPS receiver and input to a microprocessor 33. The GPS receiver 31 is clocked by a local oscillator 35. The local oscillator 35, however, instead of being free-running as in FIG. 1, is incorporated in a closed loop and is responsive to an Electronic Frequency Control (EFC) signal 37 to vary its frequency to bring it into synchronism with the GPS system. The EFC signal 37 is produced by a Number Controlled Voltage Generator (NCVG) 39 in response to a time bias signal produced by the microprocessor 33.

In operation, the microprocessor 33 continually receives from the GPS receiver 31 measurement data from all of the satellites. Based on the measurement data, the microprocessor 33 computes the time bias $\Delta T$ of the local oscillator 35 in a manner well-known in the art. A digital data word representing the time bias is output from the microprocessor 33 on a data bus 41 and is input to the number controlled voltage generator 39. The number controlled voltage generator 39 receives also as an input the frequency output signal 43 of the local oscillator 35. The number controlled voltage generator 39 generates an electronic frequency control signal 37 having the appropriate magnitude to correct the rate of oscillation of the local oscillator 35 for the computed time bias. The time bias is therefore driven to zero in a closed loop fashion. The local oscillator 35 therefore outputs a 10 Mhz signal that is GPS synchronized. This signal may be divided down to produce a precise low jitter 1 pulse per second time output signal, using a frequency divider 45, for example. An oscillator or frequency synthesizer may be used to generate an output frequency other than 10 MHz.

In comparison with FIG. 1, the GPS clock of FIG. 3 represents a frequency-based approach to the problem of producing a precise time output instead of a time-based approach. That is, in the apparatus of FIG. 1, a clock signal derived from a free-running local oscillator is "jammed" to produce a 1 pulse per second time output whose short-term average is accurate in relation to GPS time. In the apparatus of FIG. 3, on the other hand, rather than jamming the clock, the frequency of the oscillator, from which the clock signal is derived, is varied, producing a very gradual correction in the clock output signal. The latter technique is referred to as "slewing the clock" as compared to "setting" the clock. Most importantly, however, the oscillator is coupled in a closed-loop fashion in such a manner as to drive the time bias to zero, achieving synchronization with the GPS system.

In a preferred embodiment, the number controlled voltage generator 39 is realized using a number controlled oscillator 51 and a filter 53 as shown in FIG. 4. The number controlled oscillator produces an overflow, or carry output pulse that occurs at a rate proportional to the input word. The filter 53 averages the pulse frequency modulated pulse train to produce a corresponding DC voltage. In a preferred embodiment, the control word input to the number controlled oscillator 51 is 24 bits wide, and the number controlled oscillator 51 generates a carry signal C having a pulse rate given by $C=(CLOCKIN \times N)/2^{24}$, where N may have a value from 0 to $2^{24}$.

Many applications require a precision frequency source that operates uninterrupted. In such applications, a user may desire to provide a backup precision frequency source instead of relying solely on GPS. The backup frequency source may be, for example, a Rubidium Standard or high quality Quartz oscillator system. The local oscillator 35 of FIG. 3, on the other hand, is a low-cost oscillator that, when free-running, exhibits relatively high frequency drift. In such an instance, the local oscillator (having a variable frequency output) may be slaved to the more precise external frequency source while still being coupled in a closed loop. The local oscillator then produces a frequency output signal that is synchronized to GPS so long as GPS transmissions may be received without interruption and is synchronized to the more precise external frequency source when GPS transmissions cannot be successfully received. This configuration is shown in FIG. 5.

Referring to FIG. 5, the electronic frequency control signal 37 input to the local oscillator 35, instead of being produced by a number controlled voltage generator as in FIG. 3, is produced by the combination of a number controlled oscillator 51, a phase detector 57 and a loop filter 55. The number controlled oscillator 51 is connected to receive the output signal 43 of the local oscillator 35 and a digital word representing time bias produced by the microprocessor 33 on the data bus 41. The number controlled oscillator 51 produces in response a frequency output signal $F_{out}$. The frequency output signal $F_{out}$ is input to the phase detector 57 together with the frequency output signal 59 of the external frequency source (not shown). The phase detector 57 produces an error signal that is filtered by the loop filter 55 so as to produce the electronic frequency control signal 37.

In a preferred embodiment, the number controlled oscillator 51 receives a 48 bit input word and produces an output signal whose frequency is given by $F_{out}=($-

CLOCKIN×N)/$2^{48}$. When the GPS clock is first powered up, N is set to a pre-programmed number that produces an output frequency $F_{out}$ equal to the external reference frequency 59. The phase detector 57 therefore produces error signals that maintain a lock condition of the local oscillator 35 and the external frequency source 59. As ΔT values are computed and input to the NCO 51, the output frequency $F_{out}$ is caused to vary from the external reference frequency 59. The phase detector 57 therefore produces an error signal that causes the output frequency of the local oscillator 35 to be varied until a locked condition is again obtained.

When GPS signals cannot be received successfully, N is frozen at the last known good value. The output of the local oscillator 35 will then be slaved to the external reference frequency 59. When GPS signals are restored, operation will resume as previously described, whereby the output of the local oscillator will become synchronized to the GPS system.

As indicated in phantom lines in FIG. 5, the circuits of FIG. 3 and FIG. 5 may be combined such that the GPS clock may be used with or without an external frequency source at the option of the user. When the switch 61 is in the position indicated in FIG. 5, the GPS clock is configured to operate with an external frequency source. When the switch is in the opposite position, the GPS is configured to operate without an external frequency source.

Using the described GPS clock, performance comparable to a Cesium Standard may be obtained at a cost comparable to that of Quartz oscillator systems. A frequency output (such as 10 MHz) with an accuracy of $5 \times 10^{-12}$ may be obtained. A corrected 1pps output with less than 1 ns jitter may be obtained.

The foregoing has described the principles, preferred embodiments and modes of operation of the present invention. However, the invention should not be construed as limited to the particular embodiments discussed. Instead, the above-described embodiments should be regarded as illustrative rather than restrictive and it should be appreciated that variations may be made in the embodiments by workers skilled in the art without departing from the scope of the present invention as defined by the following claims.

What is claimed is:

1. A system comprising:
    a GPS receiver that receives and produces as output signals GPS information;
    a variable frequency oscillator having a frequency control input terminal and producing an output frequency signal coupled to the GPS receiver;
    data processing means, coupled to receive the output signals produced by the GPS receiver, for producing an error signal indicative of a difference in frequency between a GPS synchronized frequency and the output frequency signal of the variable frequency oscillator; and
    means responsive to said error signal for producing an electronic frequency control signal and for applying the electronic frequency control signal to said frequency control input as to cause said difference in frequency to be reduced.

2. The apparatus of claim 1 wherein said means for producing an electronic frequency control signal comprises a number controlled voltage generator.

3. The apparatus of claim 2 wherein said number controlled voltage generator comprises a number controlled oscillator and a filter, a carry output signal of the number controlled oscillator being input to the filter.

4. The apparatus of claim 1 wherein said means for producing an electronic frequency control signal comprises a number controlled oscillator.

5. The apparatus of claim 4 wherein said means for producing an electronic frequency control signal further comprises an external frequency source and a phase detector, an output frequency signal of the number controlled oscillator and an external frequency signal produced by the external frequency source being input to the phase detector to produce a signal related to a difference in frequency between the output frequency signal of the number controlled oscillator and the external frequency signal.

6. The apparatus of claim 5 further comprising a loop filter responsive to an output of said phase detector, an output signal of the loop filter forming the electronic frequency control signal.

7. The apparatus of claim 6 further comprising a filter responsive to a carry output of the number controlled oscillator to produce an alternate electronic frequency control signal, and switch means for selecting one of the electronic frequency control signal and the alternate electronic frequency control signal for input to the variable frequency oscillator.

* * * * *